United States Patent
Kitagawa

(10) Patent No.: US 10,584,426 B2
(45) Date of Patent: Mar. 10, 2020

(54) METHOD FOR PRODUCING SINGLE CRYSTAL

(71) Applicant: SHIN-ETSU HANDOTAI CO., LTD., Tokyo (JP)

(72) Inventor: Katsuyuki Kitagawa, Nishigo-mura (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 85 days.

(21) Appl. No.: 15/761,573

(22) PCT Filed: Sep. 26, 2016

(86) PCT No.: PCT/JP2016/004329
§ 371 (c)(1),
(2) Date: Mar. 20, 2018

(87) PCT Pub. No.: WO2017/068754
PCT Pub. Date: Apr. 27, 2017

(65) Prior Publication Data
US 2018/0340269 A1    Nov. 29, 2018

(30) Foreign Application Priority Data
Oct. 19, 2015   (JP) .................. 2015-205700

(51) Int. Cl.
*C30B 15/02* (2006.01)
*C30B 29/06* (2006.01)
*C30B 15/20* (2006.01)

(52) U.S. Cl.
CPC .............. *C30B 15/02* (2013.01); *C30B 15/20* (2013.01); *C30B 29/06* (2013.01)

(58) Field of Classification Search
CPC ................................. C30B 15/02; C30B 15/20
See application file for complete search history.

(56) References Cited

U.S. PATENT DOCUMENTS 4,915,775 A      4/1990  Katsuoka et al.
6,805,746 B2 *  10/2004  Moroishi ................. C30B 15/02
                                                                                117/214
(Continued)

FOREIGN PATENT DOCUMENTS

JP       S62-260791 A      11/1987
JP       S64-024089 A       1/1989
(Continued)

OTHER PUBLICATIONS

Dec. 6, 2016 International Search Report issued in International Patent Application No. PCT/JP2016/004329.

*Primary Examiner* — Robert M Kunemund
(74) *Attorney, Agent, or Firm* — Oliff PLC

(57) ABSTRACT

The present invention is a method for producing a single crystal, the method in which, after a charging process, a crucible position setting process including a step of placing a lower end of a conical valve below a lower end of a purge tube, a step of performing a movement in such a way that the conical valve and the crucible get relatively closer to each other while measuring changes in the weight of the conical valve, a step of detecting contact between the lower end of the conical valve and an upper end of a raw material based on the rate of change in the weight of the conical valve, a step of measuring the position of the upper end of the raw material based on the position of the lower end of the conical valve at which the contact was detected, and a step of setting the position of the crucible so that the spacing between the lower end of the purge tube and the upper end of the raw material charged in the crucible becomes a predetermined distance and a melting process including a crucible position adjusting step of adjusting the position of the crucible so that the spacing between the lower end of the purge tube and the upper end of the raw material maintains a predetermined distance in accordance with the progress of melting of the (Continued)

raw material are performed. As a result, it is possible to perform control so that the spacing between the lower end of the purge tube and the upper end of the raw material charged in the crucible becomes a predetermined distance.

20 Claims, 6 Drawing Sheets

(56) References Cited

U.S. PATENT DOCUMENTS

| | | | | |
|---|---|---|---|---|
| 6,908,509 B2 * | 6/2005 | Nakashima | ............ | C30B 15/02 |
| | | | | 117/13 |
| 7,311,772 B2 * | 12/2007 | Nakashima | ............ | C30B 15/02 |
| | | | | 117/13 |
| 9,650,724 B2 * | 5/2017 | Kitagawa | ................ | C30B 15/02 |
| 2004/0112276 A1 | 6/2004 | Nakashima et al. | | |
| 2008/0011222 A1 | 1/2008 | Shimomura et al. | | |
| 2011/0036860 A1 * | 2/2011 | Fujiwara | ................ | C30B 15/02 |
| | | | | 117/213 |
| 2015/0233013 A1 | 8/2015 | Kitagawa et al. | | |

FOREIGN PATENT DOCUMENTS

| | | |
|---|---|---|
| JP | H02-157180 A | 6/1990 |
| JP | H10-158091 A | 6/1998 |
| JP | H11-180794 A | 7/1999 |
| JP | H11-263693 A | 9/1999 |
| JP | 2000-169286 A | 6/2000 |
| JP | 2001-010892 A | 1/2001 |
| JP | 2004-083322 A | 3/2004 |
| JP | 2008-019125 A | 1/2008 |
| JP | 2014-101254 A | 6/2014 |
| WO | 02/068732 A1 | 9/2002 |

* cited by examiner

METHOD FOR PRODUCING SINGLE CRYSTAL

TECHNICAL FIELD

The present invention relates to a method for producing a single crystal.

BACKGROUND ART

As a method for producing a silicon single crystal which is used as a substrate of a semiconductor integrated circuit, there is the Czochralski Method (the CZ method), and, in particular, the Magnetic Field applied Czochralski method (the MCZ method) that applies a magnetic field has become prevalent.

In these CZ/MCZ methods, a silicon raw material is charged into a quartz crucible and melted, and a seed crystal is immersed in the raw material melt and then pulled upwardly, whereby a silicon single crystal can be grown. In a single crystal production apparatus (a pulling apparatus) of the CZ/MCZ methods, a heater that heats the raw material melt is placed in a main chamber, and a quartz crucible containing the raw material melt is provided inside the heater.

In general, a raw material is first charged into this quartz crucible, and the raw material is melted by heating by the heater. With the recent increase in the diameter of a silicon single crystal and the length of the crystal, the raw material initially charged into the quartz crucible alone is not enough and a raw material is added in some cases. This is called additional charge by which, as in the case of recharge, which will be described later, the raw material is packed in a recharge pipe having, at a lower end thereof, a valve having the form of a cone (a conical valve) and the raw material is input to the quartz crucible by using the recharge pipe. Then, after all the raw material is melted, the growth of a silicon single crystal is started.

The inside of the quartz crucible is filled with raw material melt which is the molten raw material, and a silicon single crystal is grown therefrom. The grown single crystal is housed in a pull chamber connected to a main chamber upper part via a gate valve and is cooled.

In such production of a single crystal, if only one single crystal is grown from one quartz crucible, the growth of a single crystal is finished at this point of time; however, the quartz crucible is broken and cannot be used again, which increases production costs. Thus, multiple operations by which a plurality of single crystals are grown from one quartz crucible are sometimes performed. In that case, since the raw material melt in the quartz crucible is reduced by an amount corresponding to the grown crystal after the growth of the single crystal, a next single crystal cannot be grown in this state. Therefore, to make up for reduction in the raw material melt, recharge by which the raw material is input again is performed.

As a method of recharge, a rod recharge method, a method of feeding a raw material from a raw material tank as disclosed in Patent Literature 1, and the like have been proposed in the past. However, the technique described in many Patent Literatures is the method of putting a raw material into a recharge pipe having a conical valve at a lower end thereof and inputting the raw material put in the recharge pipe to a quartz crucible. The basics of this technique are disclosed in Patent Literatures 2, 3, and 4.

In such a method, after a silicon single crystal is taken out of a pull chamber partitioned with a gate valve, the recharge pipe in which the raw material is put is attached by being hung with a wire, the gate valve is opened after the inside of the pull chamber is replaced with an argon atmosphere and the furnace pressure is then made to coincide with the furnace pressure in the main chamber, and, after the recharge pipe is moved downward, the opening of the recharge pipe is opened by moving the conical valve downward and the raw material is input.

The raw material which is charged in the manner described above is usually a polycrystal or, in some rare cases, a single crystal and those obtained by crushing these crystals are used, and there are voids between them in a state in which they are packed in the recharge pipe. Thus, to add the raw material corresponding to an amount by which the single crystal was grown, only one input using the recharge pipe sometimes cannot input a sufficient amount of the raw material. In such a case, input of the raw material by the recharge pipe is repeated multiple times.

For example, a method of controlling, during input of a recharge raw material, the positions of a recharge pipe and a conical valve and the position of a quartz crucible into which the input raw material is put is disclosed in Patent Literature 4.

CITATION LIST

Patent Literature

Patent Literature 1: Japanese Unexamined Patent Publication (Kokai) No. Sho 62-260791

Patent Literature Japanese Unexamined Patent Publication (Kokai) No. Hei 2-157180

Patent Literature 3: WO 2002/068732

Patent Literature 4: Japanese Unexamined Patent Publication (Kokai) No. 2014-101254

Patent Literature 5: Japanese Unexamined Patent Publication (Kokai) No. Hei 11-263693

Patent Literature 6: Japanese Unexamined Patent Publication (Kokai) No. 2000-169286

DISCLOSURE OF INVENTION

Problem to be Solved by the Invention

When the input of the raw material to the quartz crucible by using the recharge pipe is finished, the quartz crucible is located below the heat generation center of the heater. If the quartz crucible is fixed in such a position and melting of the raw material is performed, problems such as variations in the melting time and deformation and collapse of an upper wall of the quartz crucible as a result of the quartz crucible upper part being heated may arise. Moreover, due to a difference in raw material melting rate between the central region and the peripheral region of the quartz crucible, a raw material core which was not melted is left in the central region as a shelf-like portion, and the raw material falls at a stretch when the non-melted raw material core left in the central region melts, which becomes a factor that causes problems such as splashes of hot melt and breakage of the quartz crucible.

Thus, a worker has made an adjustment by manually operating the switches so that the distance between a lower end of a purge tube and an upper end of the raw material becomes a fixed spacing at all times while visually checking the state of a heap of the raw material in the furnace. However, in recent years, with the progress of energy conservation by the enhancement of heat insulation of a furnace structure (a hot zone), a field of view through an observation window has increasingly narrowed and, in addition thereto, the raw material immediately below the purge tube cannot be seen, which makes it difficult to make an adjustment by judging the distance to an upper end of the raw material unless the worker is a skillful worker.

Moreover, the adjustment position and adjustment timing vary depending on the skill level of workers and a difference in sense among individuals, which undesirably causes variations in the melting time.

Related art concerned with positioning which is performed when the raw material is fed includes a proposal to use a laser length measurement sensor that detects the raw material position or a camera, which is described in Patent Literature 4, a solidification surface position detecting method of Patent Literature 5, and a method for setting a screen portion, which is described in Patent Literature 6; however, even when such methods are used, it is difficult to control the spacing between the raw material and the purge tube so as to be a predetermined value.

The mountain-like shape of the raw material in the quartz crucible shortly after the input of the raw material changes each time depending on the charge amount, the way in which the raw material is packed into the recharge pipe, a swing of the conical valve during the input, the input rate, and so forth. Moreover, since the raw material immediately below the purge tube cannot be seen with a raw material position detecting unit such as a CCD camera, it is difficult to adjust the distance to an appropriate distance at which the purge tube and the raw material do not interfere with each other.

The present invention has been made in view of the problem described above and an object thereof is to provide a method for producing a single crystal, the method that can determine the crucible position with a high degree of precision so that, after a raw material put in a recharge pipe is charged into a crucible, the spacing between a lower end of a purge tube and an upper end of the raw material charged in the crucible becomes a predetermined distance.

Means for Solving Problem

To attain the object, the present invention provides a method for producing a single crystal, comprising:

a charging process of putting a raw material into a recharge pipe including a cylindrical member into which the raw material is put and a conical valve for opening and closing an opening of the cylindrical member formed at a lower end thereof, setting the recharge pipe in which the raw material is put in a purge tube placed in a chamber, and, by opening the opening of the cylindrical member formed at the lower end thereof by moving the conical valve downward, charging the raw material put in the recharge pipe into a crucible;

a melting process of melting the raw material in the crucible to turn the raw material into raw material melt; and a process of pulling a single crystal upwardly from the raw material melt, wherein after the charging process, a crucible position setting process of setting a position of the crucible is performed so that a distance between a lower end of the purge tube and an upper end of the raw material charged in the crucible becomes a predetermined distance, the crucible position setting process includes a step of placing a lower end of the conical valve below the lower end of the purge tube, a step of performing a movement in such a way that the conical valve and the crucible get relatively closer to each other while measuring changes in a weight of the conical valve, a step of detecting contact between the lower end of the conical valve and the upper end of the raw material based on a rate of change in the weight of the conical valve, a step of measuring a position of the upper end of the raw material based on a position of the lower end of the conical valve at which the contact was detected, and a step of setting a position of the crucible so that a spacing between the lower end of the purge tube and the upper end of the raw material charged in the crucible becomes a predetermined distance, and the melting process includes a crucible position adjusting step of adjusting the position of the crucible so that the spacing between the lower end of the purge tube and the upper end of the raw material maintains a predetermined distance in accordance with a progress of melting of the raw material.

By doing so, it is possible to determine the crucible position with a high degree of precision so that the spacing between the upper end of the raw material charged in the crucible and the lower end of the purge tube becomes a predetermined distance.

At this time, it is possible that the step of performing a movement in such a way that the conical valve and the crucible get relatively closer to each other while measuring changes in the weight of the conical valve performs a movement in such a way that the conical valve and the crucible get relatively closer to each other by moving the crucible upward in a state in which the conical valve is stopped, moving the conical valve downward in a state in which the crucible is stopped, or moving both the conical valve and the crucible.

By doing so, it is possible to perform the movement in such a way that the conical valve and the crucible get relatively closer to each other.

Moreover, at this time, it is preferable that, in the step of placing the lower end of the conical valve below the lower end of the purge tube, the lower end of the conical valve is placed 100 mm or more below the lower end of the purge tube and put on standby.

By doing so, it is possible to prevent contact between the raw material and the purge tube more reliably when bringing the raw material charged in the crucible and the conical valve into contact with each other.

Furthermore, at this time, it is preferable that, in the step of performing a movement in such a way that the conical valve and the crucible get relatively closer to each other while measuring changes in the weight of the conical valve, a relative rate at which the movement in such a way that the conical valve and the crucible get relatively closer to each other is performed is set at 50 to 150 mm/min.

By doing so, it is possible to prevent the influence on productivity without spending too much time while preventing the conical valve or a recharging tool from being broken due to an impact caused by contact between the raw material charged in the crucible and the conical valve.

Moreover, at this time, it is preferable that the step of detecting contact between the lower end of the conical valve and the upper end of the raw material based on the rate of change in the weight of the conical valve detects that the lower end of the conical valve and the raw material have come into contact with each other if, on an assumption that a weight of the conical valve in a state in which the raw material is charged into the crucible and the recharge pipe becomes empty is a reference weight, a measured weight of the conical valve is lighter than the reference weight by 20% or more and then stops performing a movement in such a way that the conical valve and the crucible get relatively closer to each other.

By doing so, it is possible to detect contact between the lower end of the conical valve and the upper end of the raw material stably while preventing false detection caused by a swing of the conical valve.

In addition, at this time, it is preferable that the crucible position adjusting step detects a position of the raw material by a second raw material position detecting unit and adjusts the position of the crucible in such a way as to make up for an amount of change in the detected value.

By doing so, it is possible to make the spacing between the lower end of the purge tube and the upper end of the raw material become a fixed distance at all times in the melting process. As a result, since variations in the crucible position operation are eliminated as compared to a case in which a judgment is visually made by the operator, it is possible to reduce the melting time.

Moreover, at this time, it is preferable that the second raw material position detecting unit is a CCD camera.

As described above, in the melting process, as the second raw material position detecting unit for detecting the position of the raw material, the CCD camera can be used.

Furthermore, at this time, it is preferable that setting of the crucible position in the crucible position setting process and an adjustment of the position of the crucible in the melting process are performed automatically.

As described above, as a result of the operations which are performed from the input of the raw material to melting being automated, variations in a judgment visually made by the operator and the crucible position operation and operation mistakes are eliminated, and it is possible to make the melting time uniform and shorter.

In addition, at this time, it is preferable that, in the melting process, a position of a heater for melting the raw material put in the crucible is controlled automatically in accordance with an adjustment of the crucible position.

By doing so, since it is possible to perform control so that the heat generation center of the heater is located below the raw material charged in the crucible, it is possible to prevent the following troubles: collapse of the quartz crucible because of high power setting during melting, or due to a difference in raw material melting rate between the central region and the peripheral region of the quartz crucible, the non-melted raw material core is left in the central region as a shelf-like portion and the raw material falls at a stretch when the non-melted raw material core left in the central region melts, which causes splashes of hot melt or breakage of the quartz crucible.

Effect of the Invention

With the method for producing a single crystal of the present invention, it is possible to determine the crucible position with a high degree of precision so that the spacing between an upper end of a raw material charged in a crucible and a lower end of a purge tube becomes a predetermined distance. This reduces variations in the melting time, the melting time, and troubles which may occur during melting.

BEST MODE(S) FOR CARRYING OUT THE INVENTION

Hereinafter, an embodiment of the present invention will be described, but the present invention is not limited thereto. As described above, there has been the following problem: after the raw material put in a recharge pipe is charged into a crucible, it is difficult to perform control so that the spacing between a lower end of a purge tube and an upper end of the raw material charged in the crucible becomes a predetermined distance.

Thus, the inventor of the present invention has conducted intensive studies to solve such a problem. As a result, the inventor of the present invention has found a method of setting the position of a crucible so that the spacing between a lower end of a purge tube and an upper end of the raw material charged in the crucible becomes a predetermined distance by performing, after charging the raw material into the crucible, a movement in such a way that the conical valve and the crucible get relatively closer to each other while measuring changes in the weight of the conical valve, detecting contact between a lower end of the conical valve and the upper end of the raw material based on the rate of change in the weight of the conical valve, and measuring the position of the upper end of the raw material based on the position of the lower end of the conical valve at which the contact was detected. The inventor of the present invention has found that this makes it possible to determine the crucible position with a high degree of precision so that the spacing between the upper end of the raw material charged in the crucible and the lower end of the purge tube becomes a predetermined distance. Then, the inventor of the present invention has closely examined the best mode for carrying out these processing and completed the present invention.

Figure 2:
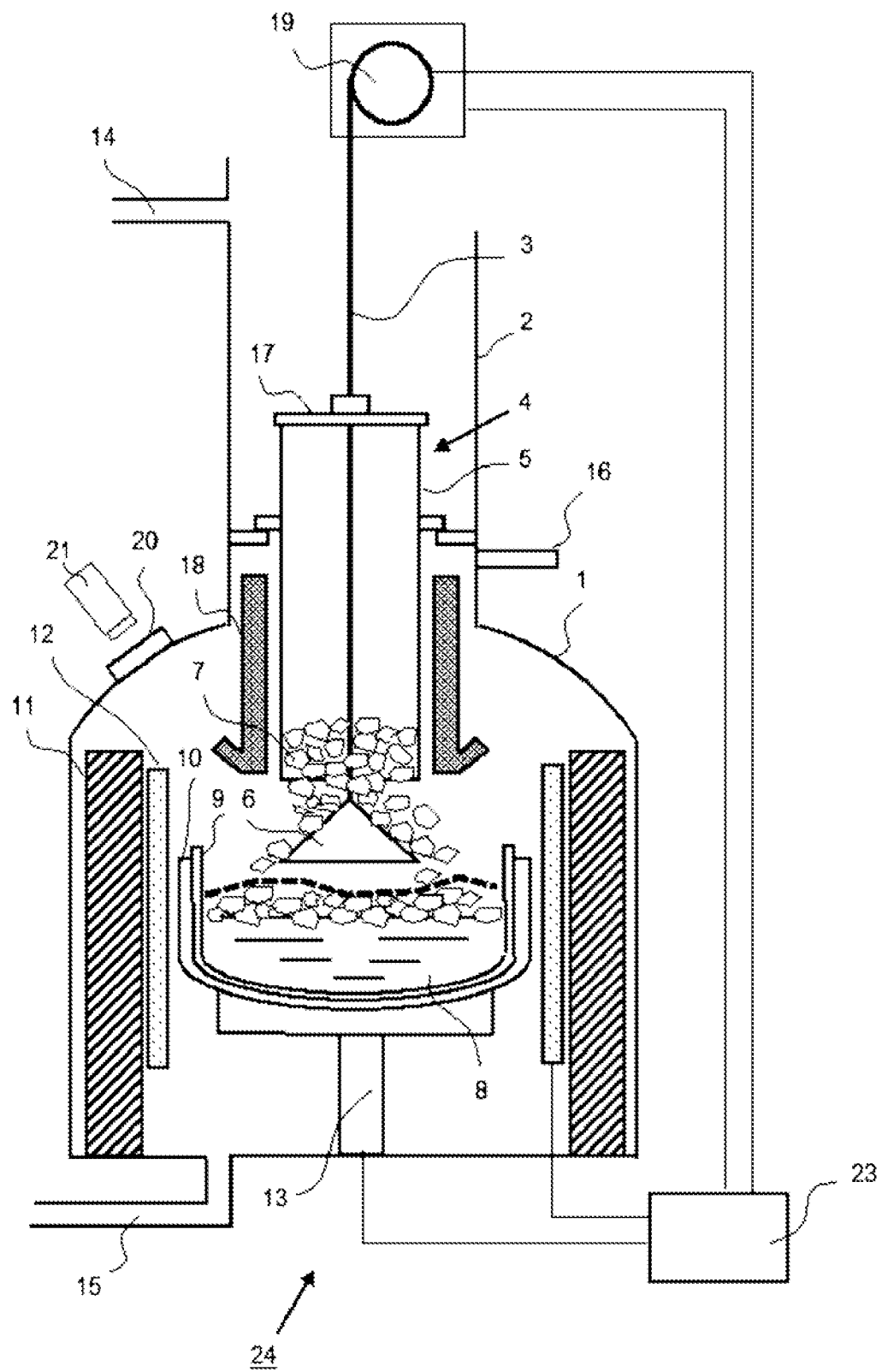
FIG. 2 is a schematic diagram depicting an example of a single crystal production apparatus which can be used in the present invention.

First, a single crystal production apparatus that can be used in a method for producing a single crystal of the present invention will be described. As depicted in FIG. 2, a single crystal production apparatus 24 includes a main chamber 1, a quartz crucible 9 and a graphite crucible 10 which house raw material melt 8 in the main chamber 1, a heater 12 which is placed around the quartz crucible 9 and the graphite crucible 10, a heat insulating member 11 around the outside of the heater 12, a purge tube 18 placed in an upper part of the main chamber 1, a pull chamber 2 that is connected to the upper part of the main chamber 1 via a gate valve 16 and houses a grown single crystal (single crystal ingot), and a recharge pipe 4.

In the pull chamber 2, a gas inlet 14 that introduces gas which flows downward in a furnace is provided, and, in the bottom of the main chamber 1, a gas outlet 15 discharging the gas which has circulated through the furnace is provided.

The quartz crucible 9 and the graphite crucible 10 are installed in such a way that the quartz crucible 9 and the graphite crucible 10 can be moved upward and downward in a crystal growth axial direction via a support shaft 13, and the upward and downward movement thereof is controlled by a control section 23. The control section 23 performs control so that the liquid level of the raw material melt 8 is maintained at a nearly constant level by moving the quartz crucible 9 and the graphite crucible 10 upward so as to make up for the raw material melt 8 whose liquid level was lowered due to the crystallization of the raw material melt 8 during crystal growth.

The tip of a wire 3 is fixed to a conical valve 6 of the recharge pipe 4, and, by letting out the wire 3 downward, the conical valve 6 can be moved downward. The upward and downward movement of the wire 3 is controlled by the control section 23. Moreover, to the wire 3, a load cell 19 that can measure the weight is connected.

Figure 3:
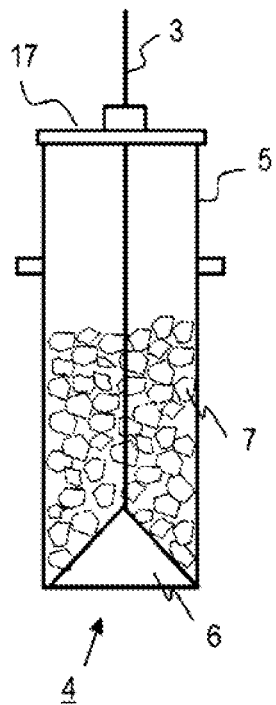
FIG. 3 is a schematic diagram depicting an example of a recharge pipe.

As depicted in FIG. 3, the recharge pipe 4 includes a cylindrical member 5 made of quartz, the cylindrical member 5 into which a raw material 7 (a polycrystal or a single crystal) is put, the conical valve 6 made of quartz for opening and closing an opening of the cylindrical member 5 formed at the lower end thereof, and a recharge pipe lid 17 that is attached to an upper end of the cylindrical member 5.

The raw material 7 put in the recharge pipe 4 can be input to the quartz crucible 9 by solidifying the surface of the raw material melt 8 in the quartz crucible 9 by lowering the power of the heater 12 and then opening the opening by moving the conical valve 6 downward as depicted in FIG. 2. The recharge pipe 4 is set by being hung with the wire 3 in the pull chamber 2 at the time of input of the raw material 7 and is removed when a single crystal is produced after the input of the raw material.

Next, the method for producing a single crystal of the present invention will be described in detail with reference to FIGS. 1 to 4. Hereinafter, a case in which the single crystal production apparatus 24 described above is used will be described.

Figure 1:
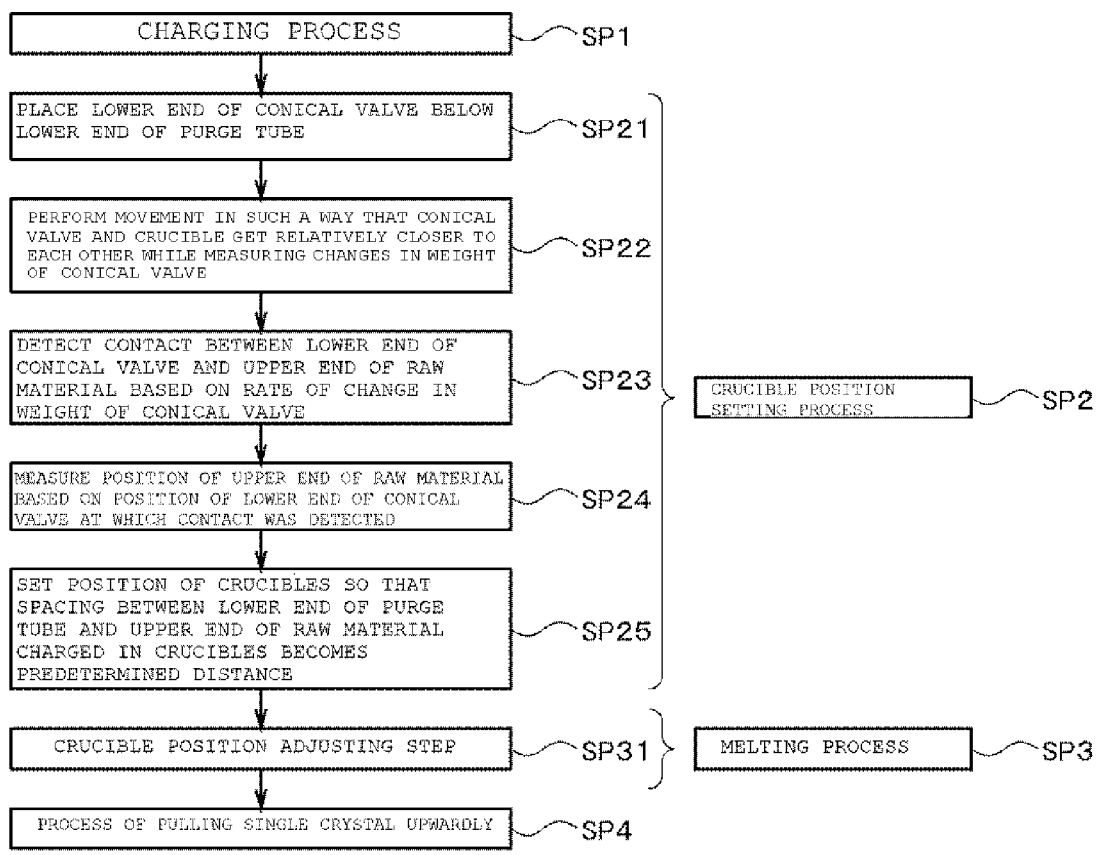
FIG. 1 is a process diagram depicting an example of a method for producing a single crystal of the present invention.

First, a charging process of putting the raw material 7 into the recharge pipe 4, setting the recharge pipe 4 containing the raw material 7 in the purge tube 18 placed in the main chamber 1, and charging the raw material 7 put in the recharge pipe 4 into the crucibles 9 and 10 by opening the opening of the cylindrical member 5 formed at the lower end thereof by moving the conical valve 6 downward is performed (SP1 of FIG. 1).

Specifically, the charging process is performed in the manner described below, for example. First, as depicted in FIG. 4(a), by moving the conical valve 6 downward, the opening of the cylindrical member 5 of the recharge pipe 4 formed at the lower end of the cylindrical member 5 is opened, and charging of the raw material 7 into the quartz crucible 9 is started. At this time, as disclosed in, for example, Patent Literature 4, by moving the position of the crucibles 9 and 10 downward by the control section 23 in accordance with the downward movement of the conical valve 6, it is possible to charge the raw material 7 into the crucibles 9 and 10 uniformly.

At this time, as depicted in FIG. 4(b), it is preferable that the crucibles 9 and 10 are moved downward during charging of the raw material 7 so that an upper end 22 of the charged raw material 7 and the conical valve 6 are located in positions in which the upper end 22 of the charged raw material 7 and the conical valve 6 are not in contact with each other at the time of the completion of charging of the raw material 7.

Then, a crucible position setting process of setting the position of the crucible is performed so that the distance between a lower end of the purge tube 18 and the upper end of the raw material 7 charged in the crucibles 9 and 10 becomes a predetermined distance (SP2 of FIG. 1). The crucible position setting process (SP2) includes the following steps (SP21 to SP25 of FIG. 1).

First, a lower end of the conical valve 6 is placed below the lower end of the purge tube 18 (SP21 of FIG. 1). It is to be noted that this step SP21 may be performed concurrently with the downward movement of the conical valve 6 in the charging process. That is, when the raw material 7 is charged into the crucibles 9 and 10, control can be performed so that the lower end of the conical valve 6 is located below the lower end of the purge tube 18 at the time of the completion of charging of the raw material 7.

Even when input is performed in the charging process so that the mountain-like shape of the upper end 22 of the raw material 7 becomes uniform as described above, the conditions of a heap of the raw material 7 charged in the crucibles 9 and 10 do not become the same each time by being affected by the way in which the raw material 7 is charged into the recharge pipe 4, the shape of the conical valve 6, a swing of the wire, or the like. Moreover, a difference in height of about 100 mm is sometimes produced in the shape of a heap of the raw material 7 charged in the crucibles 9 and 10.

Thus, preferably, the lower end of the conical valve 6 is placed 100 to 150 mm below the lower end of the purge tube 18 and put on standby. By doing so, when the raw material 7 charged in the crucibles 9 and 10 and the conical valve 6 are brought into contact with each other as will be described below, it is possible to prevent more reliably contact between the raw material 7 and the purge tube 18.

At this time, as depicted in FIG. 4(b), the weight of the conical valve 6 in a state in which the raw material 7 is charged into the crucibles 9 and 10 and the recharge pipe 4 becomes empty is measured, and this weight can be obtained as a reference weight W0. The measurement of the weight of the conical valve 6 can be performed by the load cell 19. It is to be noted that the reference weight W0 measured by the load cell 19 is the total value of the weights of a hanger of the recharge pipe 4 and the conical valve 6. Incidentally, since the conical valve 6 tends to swing when the raw material falls at the time of charging of the raw material 7, it is desirable to wait for about a few seconds until the swing becomes small and then obtain the reference weight W0. A setting example of the delay time at this time can be, for example, 10 to 30 seconds.

Next, a movement in such a way that the conical valve 6 and the crucibles 9 and 10 get relatively closer to each other is performed with changes in the weight of the conical valve 6 being measured (SP22 of FIG. 1).

The measurement of changes in the weight of the conical valve 6 can be performed by the load cell 19.

At this time, specifically, for example, as depicted in FIG. 4(c), the movement in such a way that the conical valve 6 and the crucibles 9 and 10 get relatively closer to each other can be performed by moving the crucibles 9 and 10 upward in a state in which the conical valve 6 is stopped. Alternatively, the movement in such a way that the conical valve 6 and the crucibles 9 and 10 get relatively closer to each other can be performed by moving the conical valve 6 downward in a state in which the crucibles 9 and 10 are stopped or by moving both the conical valve 6 and the crucibles 9 and 10.

Moreover, at this time, it is preferable to set the relative rate at which the movement in such a way that the conical valve 6 and the crucibles 9 and 10 get relatively closer to each other is performed at 50 to 150 mm/min. By doing so, since it is possible to prevent the process time from being lengthened while preventing the conical valve 6 or a recharging tool from being broken due to an impact caused by contact between the raw material 7 charged in the crucibles 9 and 10 and the conical valve 6, it is possible to prevent the influence on productivity.

Next, based on the rate of change in the weight of the conical valve 6, contact between the lower end of the conical valve 6 and the upper end 22 of the raw material 7 is detected (SP23 of FIG. 1).

Specifically, for example, the absolute value of a difference between the measured weight of the conical valve 6 (hereinafter referred to as the current weight W) and the reference weight W0 is calculated by the following formula (1) and a weight change |ΔW| is obtained.

$$|\Delta W| = |W - W0| \quad (1)$$

Then, the weight change |ΔW| is monitored, and, when the weight change |ΔW| exceeds a previously set threshold value, it can be judged that the lower end of the conical valve 6 and the upper end 22 of the raw material 7 has come into contact with each other. The smaller this threshold value, the higher the degree of sensitivity with which detection is performed; however, it is desirable to set the threshold value at a value with a margin in order to prevent false detection caused by a swing of the conical valve 6 as described above. For instance, if the reference weight is 3 kg, when ΔW becomes 0.6 kg or more, it is possible to detect contact between the lower end of the conical valve 6 and the upper end 22 of the raw material 7.

Figure 4:
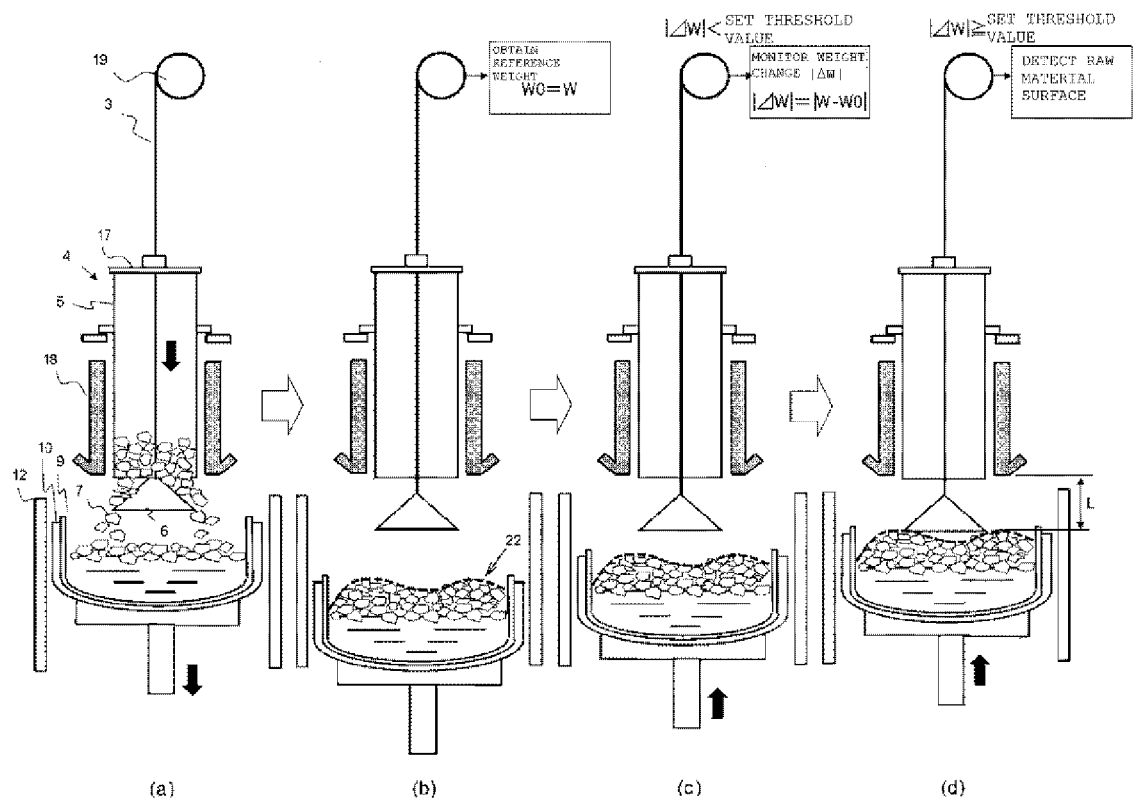
FIG. 4 is a schematic diagram depicting the flow from the input of a recharge raw material to a crucible position adjustment after the input, which is related to the present invention.

Then, as depicted in FIG. 4(*d*), when a weight change caused by the conical valve 6 raised as a result of contact between the lower end of the conical valve 6 and the upper end 22 of the charged raw material 7 is detected, it is preferable to stop the upward movement of the crucible position or the downward movement of the conical valve or both the upward movement of the crucible position and the downward movement of the conical valve. At this time, the conical valve 6 is at rest in a state in which the conical valve 6 is on the upper end 22 of the charged raw material 7.

As described above, it is preferable that, by using the weight of the conical valve in a state in which the raw material is charged into the crucible and the recharge pipe becomes empty as a reference weight, if the measured weight of the conical valve is lower than the reference weight by 20% or more, contact between the lower end of the conical valve and the raw material is detected and then the movement to make the conical valve and the crucible get relatively closer to each other is stopped. By doing so, it is possible to detect contact between the lower end of the conical valve and the upper end of the raw material stably while preventing false detection caused by a swing of the conical valve.

Next, based on the position of the lower end of the conical valve 6 at which contact was detected, the position of the upper end of the raw material 7 is measured (SP24 of FIG. 1). Then, the position of the crucibles 9 and 10 is set so that the spacing between the lower end of the purge tube 18 and the upper end of the raw material 7 charged in the crucibles 9 and 10 becomes a predetermined distance (hereinafter also referred to as a first distance) (SP25 of FIG. 1).

By doing so, it is possible to prevent a situation in which the crucibles are left for a long period of time in a state in which the crucible position after the input of the raw material is below and away from the heat generation center of the heater 12 as depicted in FIG. 4(*b*) or melting is performed in this state. In related art, after the recharge pipe 4 is lifted up, the distance between a lower end portion of the purge tube 18 and the input raw material is visually estimated by the operator and an adjustment to the crucible position is made by manual switch operation, which results in variations in the crucible position operation or melting time.

On the other hand, since the crucible position setting process is performed in the method of the present invention, it is possible to prevent the following: variations in the melting time or a difference in raw material melting rate between the central region and the peripheral region of the quartz crucible, the non-melted raw material core is left in the central region as a shelf-like portion and the raw material falls at a stretch when the non-melted raw material core left in the central region melts, which causes splashes of hot melt or breakage of the quartz crucible 9; or the quartz crucible 9 collapses as a result of an area near an upper end of the quartz crucible 9 being heated.

Incidentally, it is preferable that, in step SP21, placement is performed in advance so that the distance between the lower end of the purge tube 18 and the lower end of the conical valve 6 becomes the first distance which is set in step SP25. Then, furthermore, it is preferable that, in step SP22, the crucibles 9 and 10 are moved upward in a state in which the conical valve 6 is stopped and then, in step SP23, contact between the lower end of the conical valve and the raw material is detected and the upward movement of the crucible is stopped. By doing so, the position of the crucible which is stopped after contact with the raw material becomes the position of the crucible to be set, which makes it possible to perform setting of the crucible position more efficiently.

Before a melting process which will be described below, a series of operations such as moving the wire 3 upward to remove the recharge pipe 4, opening and closing control of the gate valve 16, returning the pressure inside the pull chamber 2 to normal pressure, and control of the position of the heater 12 is performed. These operations can be performed automatically, for example.

Next, a melting process of melting the raw material 7 in the crucibles 9 and 10 to turn the raw material 7 into the raw material melt 8 is performed (SP3 of FIG. 1).

The melting process includes a crucible position adjusting step of adjusting the position of the crucibles 9 and 10 so that the spacing between the lower end of the purge tube 18 and the upper end 22 of the raw material 7 maintains a predetermined distance (hereinafter also referred to as a second distance) in accordance with the progress of melting of the raw material 7 (SP31 of FIG. 1).

In the crucible position adjusting step (SP31 of FIG. 1), it is preferable that the position of the raw material 7 is detected by a second raw material position detecting unit and the position of the crucibles 9 and 10 is adjusted in such a way as to make up for an amount of change in the detected value. By doing so, it is possible to make the spacing between the lower end of the purge tube 18 and the upper end 22 of the raw material 7 become a fixed distance at all times in the melting process. As a result, since variations in the crucible position operation are eliminated as compared to a case in which a judgment is visually made by the operator, it is possible to reduce the melting time. Here, the first distance and the second distance may be set at the same value or may be set at different values. When the first distance and the second distance are different, the first distance can be set at 150 mm and the second distance can be set at 120 mm, for example.

Moreover, at this time, it is preferable that the second raw material position detecting unit is a CCD camera 21 as in FIG. 2. As described above, in the melting process, it is possible to use the CCD camera 21 as the second raw material position detecting unit for detecting the position of the raw material 7.

A camera for measuring the diameter and a camera for monitoring the inside of the furnace during crystal growth can be used for the CCD camera 21. It is possible to detect changes in position during melting by taking, by the CCD camera 21, an image of the raw material which can be observed through a purge tube opening through an observation window 20.

The methods of detecting changes in the raw material position include, for example, a method of using changes in the position of the laser reference light shone onto the upper face of the raw material 7, a method of taking an image of the same area by a plurality of CCD cameras 21 and using position change of parallax which is obtained from the edge portion of the raw material, and so forth. These makes it possible to detect changes in the position of the raw material which is being melted.

Specifically, for example, the second raw material position detecting unit can take an image of the raw material in the same area through the observation window 20 by using two parallel CCD cameras 21. In this case, based on the visual information obtained from the outline of the raw material 7 or a characteristic edge portion in the area, a difference between the positions of a target point at the upper end 22 of the raw material 7 is obtained on the screens of the two CCD cameras. Then, the distance from the CCD cameras to the target point at the upper end 22 of the charged raw material 7 can be measured using the principle of triangulation.

Moreover, it is preferable to perform automatically setting of the crucible position in the crucible position setting process and an adjustment of the position of the crucible in the melting process described above. As described above, as a result of the operations which are performed from the input of the raw material to melting being automated, variations in a judgment visually made by the operator and the crucible position operation and operation mistakes are eliminated and it is possible to make the melting time uniform and shorter.

Moreover, in the melting process, it is preferable to control automatically the position of the heater for melting the raw material put in the crucible in accordance with an adjustment of the crucible position. By doing so, since it is possible to perform control so that the heat generation center of the heater is located below the raw material charged in the crucible, it is possible to prevent, for example, the following troubles: collapse of an upper part of the quartz crucible because of high power setting during melting; or due to a difference in raw material melting rate between the central region and the peripheral region of the quartz crucible, the non-melted raw material core is left in the central region as a shelf-like portion and the raw material falls at a stretch when the non-melted raw material core left in the central region melts, which causes splashes of hot melt or breakage of the quartz crucible. Furthermore, by also controlling the heater so as to be located in an appropriate position, reduction in variations in the melting time, reduction of time, and reduction in troubles which may occur during melting are achieved.

After the raw material 7 in the crucibles 9 and 10 is melted in the manner described above, a process of pulling a single crystal upwardly from the raw material melt 8 is performed (SP4 of FIG. 1)

The process of pulling a single crystal upwardly can be performed in the same manner as the existing method. For example, a seed crystal fixed by a seed holder connected to a lower end of the wire is immersed in the raw material melt obtained by melting the raw material and is then pulled upwardly while being rotated, whereby it is possible to grow a single crystal having a desired diameter and quality below the seed crystal.

With such a method for producing a single crystal of the present invention, it is possible to determine the crucible position with a high degree of precision so that the spacing between the upper end of the raw material charged in the crucible and the lower end of the purge tube becomes a predetermined distance. This reduces variations in the melting time, the melting time, and troubles which may occur during melting.

EXAMPLES

Hereinafter, the present invention will be described more specifically with Examples and Comparative Example of the present invention, but the present invention is not limited to these examples.

Example 1

By using the single crystal production apparatus depicted in FIG. 2, the raw material charging process and the crucible position setting process in the present invention were performed.

The raw material charging process and the crucible position setting process in Example 1 were performed under the following conditions.

Figure 5:
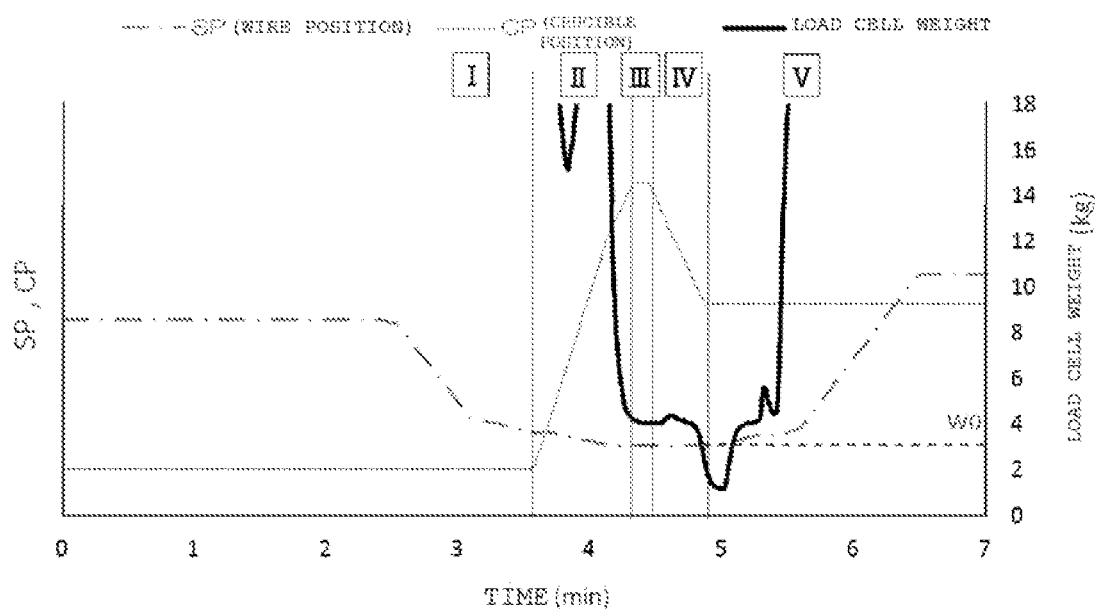
FIG. 5 is a graph showing changes in the wire position, the crucible position, and the load cell weight in Example 1.

The charge amount of the raw material 7 in the recharge pipe 4: 60 kg
The weight of the conical valve 6: 2.5 kg
The threshold value for raw material position detection: the reference weight W0×0.2
The standby position of the conical valve 6: 150 mm from the purge tube lower end
The crucible upward movement rate at the time of raw material position detection: 100 mm/min Changes in the wire position, the crucible position, and the load cell weight in Example 1 are shown in FIG. 5. Incidentally, in FIG. 5, a first vertical axis (a left-hand vertical axis) represents the wire position (SP) and the crucible position (CP), and a second vertical axis (a right-hand vertical axis) represents the load cell weight. The greater the value of SP represented by the first vertical axis is, the higher the wire position is. On the other hand, the greater the value of CP represented by the first vertical axis is, the lower the crucible position is.

First, the recharge pipe 4 was set in the pull chamber 2, and, after the inside of the pull chamber 2 was replaced with an argon atmosphere, the pressure inside the pull chamber 2 was adjusted so as to be the same as the furnace pressure of the main chamber 1. Then, the gate valve 16 was opened for input of the raw material, and the cylindrical member 5 of the recharge pipe 4 was adjusted to a raw material pre-input standby position by moving the wire 3 downward (I of FIG. 5).

Next, the opening of the cylindrical member 5 and the conical valve 6 was opened by moving the wire 3 downward, and charging of the raw material into the crucible was started. The crucible position was also moved downward concurrently with the downward movement of the wire 3 in order to input the raw material to the crucible uniformly. The crucible position after all the raw material 7 was input was kept at a sufficiently low level so that the conical valve 6 and the upper end 22 of the raw material 7 do not come into contact with each other (II of FIG. 5). The standby position of the conical valve 6 at this time was a position 150 mm from the lower end of the purge tube.

Since the weight shortly after all the raw material 7 was input was unstable due to a swing of the wire 3, a transition to a next crucible position setting process IV was slightly delayed (III of FIG. 5). In Example 1, this delay time was set at 10 seconds.

Then, in the crucible position setting process, the reference weight $W0$ was obtained, and the crucible position was moved upward concurrently with the monitoring of the weight (IV of FIG. 5). In Example 1, the reference weight $W0$ was 3.05 kg, and the threshold value was set at a weight lighter than the reference weight $W0$ by 20%. That is, if there was a weight change of 0.6 kg or more, it was judged that the conical valve 6 and the upper end 22 of the raw material 7 came into contact with each other. The results obtained in this case indicated that a weight change of 2.15 kg was observed before and after the contact. Specifically, the reference weight $W0$ before the contact was 3.05 kg and the weight after the contact was 0.87 kg. The rate of weight change in this case was about 70%. The upward movement of the crucible was stopped at the time of detection of a weight change, and the adjustment of the crucible position was completed. In this way, setting was made so that the spacing between the lower end of the purge tube and the upper end of the raw material charged in the crucible became 150 mm.

After the heater position was adjusted in accordance with the adjusted crucible position, the conical valve 6 was housed in the cylindrical member 5 by the upward movement of the wire 3 and the recharge pipe 4 was moved to the pull chamber 2, the gate valve 16 was then closed and the inside of the pull chamber 2 was returned to normal pressure, and the recharge pipe 4 was removed (V of FIG. 5).

Example 2

By using the single crystal production apparatus depicted in FIG. 2, the raw material charging process and the crucible position setting process were performed in the same manner as Example 1 except for the charge amount. The melting process was then performed and the charged raw material was melted. Then, these processes were repeatedly performed, whereby continuous recharge (5 times in total) was performed.

The raw material charging process, the crucible position setting process, and the melting process in Example 2 were performed under the following conditions.

The number of recharge inputs was five and a total of 310 kg was charged (A breakdown of the charge amount: first to third inputs 75 kg, a fourth input 65 kg, a fifth input 20 kg)

The weight of the conical valve 6: 2.5 kg

The threshold value for raw material position detection: $W0 \times 0.2$

The standby position of the conical valve 6: 150 mm from the purge tube lower end The crucible upward movement rate at the time of raw material position detection: 100 mm/min The target distance from the lower end of the purge tube to the upper end 22 of the charged raw material 7 during melting of the raw material: 120 mm After setting was made so that the spacing between the lower end of the purge tube and the upper end of the raw material charged in the crucible became 150 mm in the same manner as Example 1, the melting process was performed. In the melting process, an adjustment to the crucible position was made so as to make up for an amount corresponding to a change in the distance from the lower end of the purge tube 18 to the charged raw material 7, the change which being obtained by the second raw material position detecting unit. At this time, the target distance from the lower end of the purge tube 18 to the upper end 22 of the charged raw material 7 during melting of the raw material was set at 120 mm. Moreover, in order to reduce collapse of an upper part of the quartz crucible 9, in addition to the crucible position control during melting, control was performed so that the heat generation center of the heater position was always located below the upper end 22 of the input raw material 7.

The second raw material position detecting unit adopted a method of taking an image of the raw material 7 in the same area by using the two parallel CCD cameras 21 and measuring the distance from the cameras to the upper end 22 of the charged raw material 7 using the principle of triangulation based on the obtained visual information.

Figure 6:
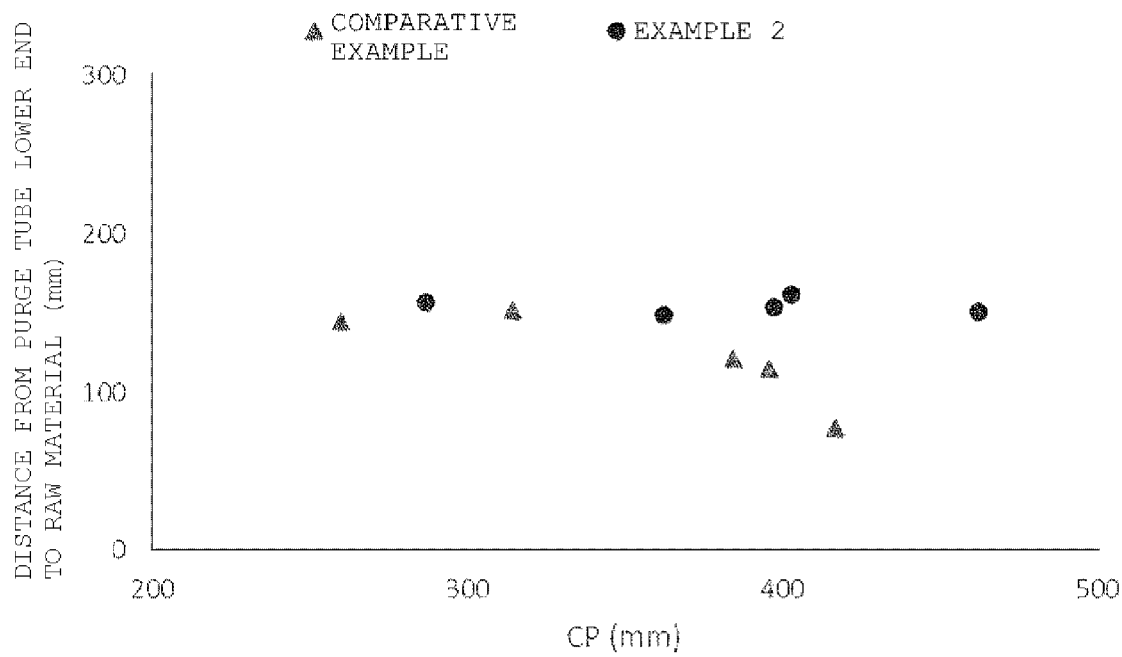
FIG. 6 is a graph showing the relationship between the distance from a lower end of a purge tube to an upper end of the charged raw material and the crucible position after each crucible position setting process in continuous recharge in Example 2 and Comparative Example.

The relationship between the distance from the lower end of the purge tube to the upper end of the charged raw material and the crucible position after each crucible position setting process in continuous recharge is shown in FIG. 6. The distance from the lower end of the purge tube to the upper end of the charged raw material after the crucible position setting process was the value measured by the second raw material position detecting unit.

Figure 7:
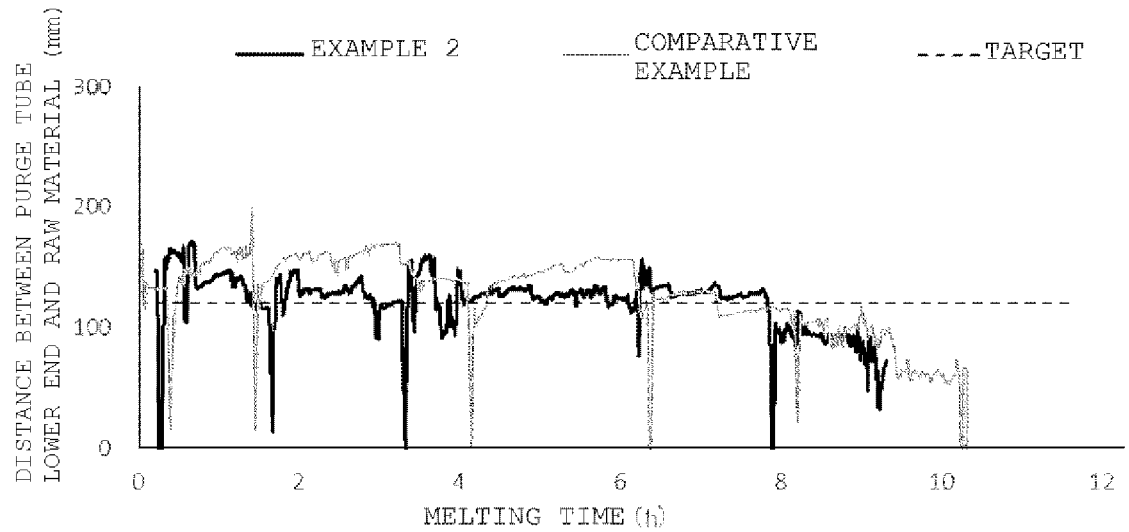
FIG. 7 is a graph showing the relationship between the distance from the lower end of the purge tube to the upper end of the charged raw material and the melting time in a melting process in Example 2 and Comparative Example.

In FIG. 7, the relationship between the distance from the purge tube lower end to the charged raw material upper end and the melting time in the melting process is shown. The horizontal axis represents the melting time (h), and the vertical axis represents the distance (mm) from the purge tube lower end to the charged raw material. The upper end 22 of the charged raw material 7 from the purge tube lower end is the measurement value measured by the second raw material position detecting unit. A portion in which a significant drop is observed in FIG. 7 is a point at which the raw material was input.

Figure 8:
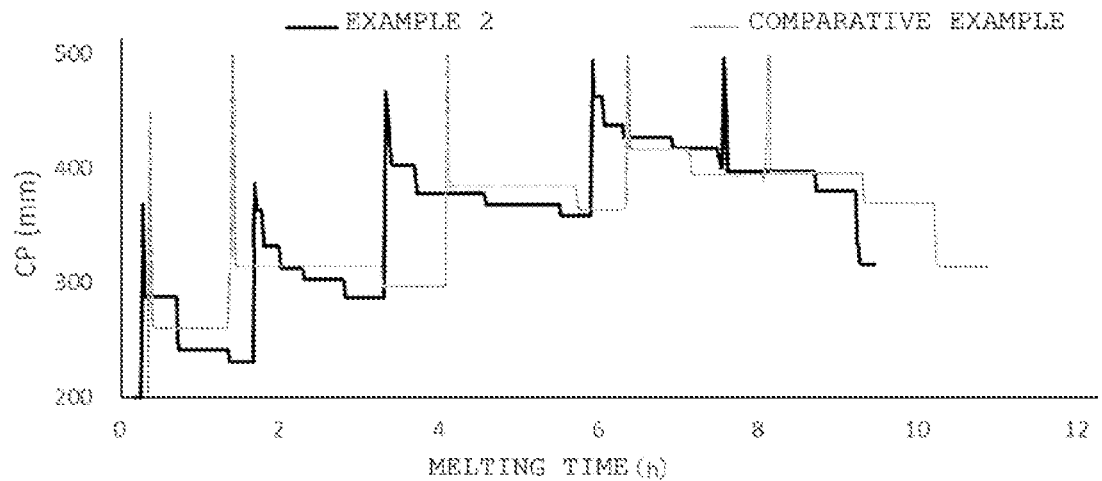
FIG. 8 is a graph showing the crucible position in the melting process in Example 2 and Comparative Example.

In FIG. 8, the crucible position (CP) in the melting process is shown. A portion in which a sharp upward point is observed in FIG. 8 is a point at which the raw material was input.

Figure 9:
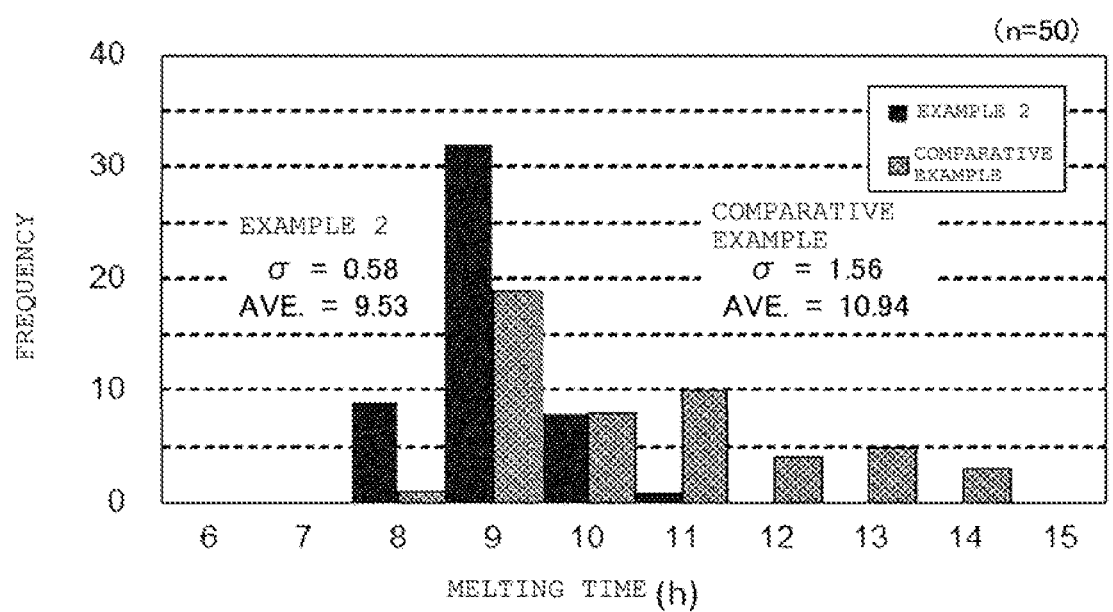
FIG. 9 is a graph showing the distribution of the time required to melt the raw material charged in a crucible in Example 2 and Comparative Example.

Continuous recharge was performed 50 times in total in the same manner as the continuous recharge described above. In so doing, in each operation of continuous recharge, the time required to melt the raw material charged in the crucible was measured and the distribution thereof is shown in FIG. 9. Incidentally, in FIGS. 6 to 9, the results of Comparative Example, which will be described later, are also shown.

When a process of pulling a single crystal upwardly from the raw material melt after the completion of the melting process was performed, production of a single crystal could be performed without problem. In addition, since the raw material melting time was reduced as compared to Comparative Example as will be described later, the overall production efficiency was high.

Comparative Example

Continuous recharge was performed in the same manner as Example 2 except that, in the crucible position setting process of Example 2, the worker made an adjustment to the crucible position by manually operating the switches while visually estimating the distance to the raw material.

The relationship between the distance from the lower end of the purge tube to the upper end of the charged raw material and the crucible position after each crucible position setting process in continuous recharge in Comparative Example is shown in FIG. 6. The results revealed that, as shown in FIG. 6, in Comparative Example, since a person made an adjustment to the crucible position while visually estimating the distance to the raw material, the adjusted crucible position varied by about 75 mm, and, in particular, the adjusted crucible position varied greatly in the latter half (the CP value>380) in which the amount of the raw material melt in the crucible was large. On the other hand, in Example 2, the crucible position varied by about 15 mm and the crucible position was adjusted so that the distance from the purge tube lower end to the upper end 22 of the charged raw material 7 became a fixed distance each time. This reduces the operator's labor required for positioning after the input of the raw material and variations in the melting conditions.

Moreover, in FIG. 7, the relationship between the distance from the purge tube lower end to the charged raw material upper end and the melting time in the melting process in Comparative Example is shown. It is clear that, as shown in FIG. 7, in Example 2, the distance from the purge tube lower end to the charged raw material upper end was stably controlled so as to be near the target value as compared to Comparative Example. Moreover, since not only the crucible position but also the heater position was controlled, the burdens on the worker in the long melting process due to continuous recharge were greatly reduced.

Furthermore, in FIG. 8, the crucible position (CP) in the melting process in Comparative Example is shown. As shown in FIG. 8, it is clear that, in Comparative Example, the melting time was longer than that in Example 2.

The distribution of the time required to melt the raw material charged in the crucible in each operation of continuous recharge when a total of 50 operations of continuous recharge were performed in Comparative Example is shown in FIG. 9. The results revealed that, as shown in FIG. 9, in Example 2, since control of the crucible position and control of the heater position in recharge melting could be automatically performed, variations in the melting time were reduced and the melting time was reduced by an average of 1.41 hours as compared to Comparative Example. Moreover, with the method of the present invention, each process can be automated, which can contribute to reduction in the number of operation mistakes and enhancement of labor productivity.

It is to be understood that the present invention is not limited in any way by the embodiment thereof described above. The above embodiment is merely an example, and anything that has substantially the same structure as the technical idea recited in the claims of the present invention and that offers similar workings and benefits falls within the technical scope of the present invention.

The invention claimed is:

1. A method for producing a single crystal, comprising:
a charging process of putting a raw material into a recharge pipe including a cylindrical member into which the raw material is put and a conical valve for opening and closing an opening of the cylindrical member formed at a lower end thereof, setting the recharge pipe in which the raw material is put in a purge tube placed in a chamber, and, by opening the opening of the cylindrical member formed at the lower end thereof by moving the conical valve downward, charging the raw material put in the recharge pipe into a crucible;
a melting process of melting the raw material in the crucible to turn the raw material into raw material melt; and
a process of pulling a single crystal upwardly from the raw material melt,
wherein
after the charging process, a crucible position setting process of setting a position of the crucible is performed so that a distance between a lower end of the purge tube and an upper end of the raw material charged in the crucible becomes a predetermined distance,
the crucible position setting process includes a step of placing a lower end of the conical valve below the lower end of the purge tube, a step of performing a movement in such a way that the conical valve and the crucible get relatively closer to each other while measuring changes in a weight of the conical valve, a step of detecting contact between the lower end of the conical valve and the upper end of the raw material based on a rate of change in the weight of the conical valve, a step of measuring a position of the upper end of the raw material based on a position of the lower end of the conical valve at which the contact was detected, and a step of setting a position of the crucible so that a spacing between the lower end of the purge tube and the upper end of the raw material charged in the crucible becomes a predetermined distance, and
the melting process includes a crucible position adjusting step of adjusting the position of the crucible so that the spacing between the lower end of the purge tube and the upper end of the raw material maintains a predetermined distance in accordance with a progress of melting of the raw material.

2. The method for producing a single crystal according to claim 1, wherein
the step of performing a movement in such a way that the conical valve and the crucible get relatively closer to each other while measuring changes in the weight of the conical valve performs a movement in such a way that the conical valve and the crucible get relatively closer to each other by moving the crucible upward in a state in which the conical valve is stopped, moving the conical valve downward in a state in which the crucible is stopped, or moving both the conical valve and the crucible.

3. The method for producing a single crystal according to claim 1, wherein
in the step of placing the lower end of the conical valve below the lower end of the purge tube, the lower end of the conical valve is placed 100 mm or more below the lower end of the purge tube and put on standby.

4. The method for producing a single crystal according to claim 2, wherein in the step of placing the lower end of the conical valve below the lower end of the purge tube, the lower end of the conical valve is placed 100 mm or more below the lower end of the purge tube and put on standby.

5. The method for producing a single crystal according to claim 1, wherein
in the step of performing a movement in such a way that the conical valve and the crucible get relatively closer to each other while measuring changes in the weight of the conical valve, a relative rate at which the movement in such a way that the conical valve and the crucible get relatively closer to each other is performed is set at 50 to 150 mm/min.

6. The method for producing a single crystal according to claim 2, wherein
in the step of performing a movement in such a way that the conical valve and the crucible get relatively closer to each other while measuring changes in the weight of the conical valve, a relative rate at which the movement in such a way that the conical valve and the crucible get relatively closer to each other is performed is set at 50 to 150 mm/min.

7. The method for producing a single crystal according to claim 3, wherein
in the step of performing a movement in such a way that the conical valve and the crucible get relatively closer to each other while measuring changes in the weight of the conical valve, a relative rate at which the movement in such a way that the conical valve and the crucible get relatively closer to each other is performed is set at 50 to 150 mm/min.

8. The method for producing a single crystal according to claim 4, wherein
in the step of performing a movement in such a way that the conical valve and the crucible get relatively closer to each other while measuring changes in the weight of the conical valve, a relative rate at which the movement in such a way that the conical valve and the crucible get relatively closer to each other is performed is set at 50 to 150 mm/min.

9. The method for producing a single crystal according to claim 1, wherein
the step of detecting contact between the lower end of the conical valve and the upper end of the raw material based on the rate of change in the weight of the conical valve detects that the lower end of the conical valve and the raw material have come into contact with each other if, on an assumption that a weight of the conical valve in a state in which the raw material is charged into the crucible and the recharge pipe becomes empty is a reference weight, a measured weight of the conical valve is lighter than the reference weight by 20% or more and then stops performing a movement in such a way that the conical valve and the crucible get relatively closer to each other.

10. The method for producing a single crystal according to claim 2, wherein
the step of detecting contact between the lower end of the conical valve and the upper end of the raw material based on the rate of change in the weight of the conical valve detects that the lower end of the conical valve and the raw material have come into contact with each other if, on an assumption that a weight of the conical valve in a state in which the raw material is charged into the crucible and the recharge pipe becomes empty is a reference weight, a measured weight of the conical valve is lighter than the reference weight by 20% or more and then stops performing a movement in such a way that the conical valve and the crucible get relatively closer to each other.

11. The method for producing a single crystal according to claim 3, wherein
the step of detecting contact between the lower end of the conical valve and the upper end of the raw material based on the rate of change in the weight of the conical valve detects that the lower end of the conical valve and the raw material have come into contact with each other if, on an assumption that a weight of the conical valve in a state in which the raw material is charged into the crucible and the recharge pipe becomes empty is a reference weight, a measured weight of the conical valve is lighter than the reference weight by 20% or more and then stops performing a movement in such a way that the conical valve and the crucible get relatively closer to each other.

12. The method for producing a single crystal according to claim 4, wherein
the step of detecting contact between the lower end of the conical valve and the upper end of the raw material based on the rate of change in the weight of the conical valve detects that the lower end of the conical valve and the raw material have come into contact with each other if, on an assumption that a weight of the conical valve in a state in which the raw material is charged into the crucible and the recharge pipe becomes empty is a reference weight, a measured weight of the conical valve is lighter than the reference weight by 20% or more and then stops performing a movement in such a way that the conical valve and the crucible get relatively closer to each other.

13. The method for producing a single crystal according to claim 5, wherein
the step of detecting contact between the lower end of the conical valve and the upper end of the raw material based on the rate of change in the weight of the conical valve detects that the lower end of the conical valve and the raw material have come into contact with each other if, on an assumption that a weight of the conical valve in a state in which the raw material is charged into the crucible and the recharge pipe becomes empty is a reference weight, a measured weight of the conical valve is lighter than the reference weight by 20% or more and then stops performing a movement in such a way that the conical valve and the crucible get relatively closer to each other.

14. The method for producing a single crystal according to claim 6, wherein
the step of detecting contact between the lower end of the conical valve and the upper end of the raw material based on the rate of change in the weight of the conical valve detects that the lower end of the conical valve and the raw material have come into contact with each other if, on an assumption that a weight of the conical valve in a state in which the raw material is charged into the crucible and the recharge pipe becomes empty is a reference weight, a measured weight of the conical valve is lighter than the reference weight by 20% or more and then stops performing a movement in such a way that the conical valve and the crucible get relatively closer to each other.

15. The method for producing a single crystal according to claim 7, wherein
the step of detecting contact between the lower end of the conical valve and the upper end of the raw material based on the rate of change in the weight of the conical valve detects that the lower end of the conical valve and the raw material have come into contact with each other if, on an assumption that a weight of the conical valve in a state in which the raw material is charged into the crucible and the recharge pipe becomes empty is a reference weight, a measured weight of the conical valve is lighter than the reference weight by 20% or more and then stops performing a movement in such a way that the conical valve and the crucible get relatively closer to each other.

16. The method for producing a single crystal according to claim 8, wherein
the step of detecting contact between the lower end of the conical valve and the upper end of the raw material based on the rate of change in the weight of the conical valve detects that the lower end of the conical valve and the raw material have come into contact with each other if, on an assumption that a weight of the conical valve in a state in which the raw material is charged into the crucible and the recharge pipe becomes empty is a reference weight, a measured weight of the conical valve is lighter than the reference weight by 20% or more and then stops performing a movement in such a way that the conical valve and the crucible get relatively closer to each other.

17. The method for producing a single crystal according to claim 1, wherein
the crucible position adjusting step detects a position of the raw material by a second raw material position detecting unit and adjusts the position of the crucible in such a way as to make up for an amount of change in the detected value.

18. The method for producing a single crystal according to claim 17, wherein
the second raw material position detecting unit is a CCD camera.

19. The method for producing a single crystal according to claim 1, wherein
setting of the crucible position in the crucible position setting process and an adjustment of the position of the crucible in the melting process are performed automatically.

20. The method for producing a single crystal according to claim 1, wherein
in the melting process, a position of a heater for melting the raw material put in the crucible is controlled automatically in accordance with an adjustment of the crucible position.

* * * * *